United States Patent
Roh et al.

(10) Patent No.: US 8,021,937 B2
(45) Date of Patent: Sep. 20, 2011

(54) ARRAY SUBSTRATE INCLUDING THIN FILM TRANSISTOR AND METHOD OF FABRICATING THE SAME

(75) Inventors: Hyung-Gu Roh, Gyeongsangnam-do (KR); Byung-Chul Ahn, Seoul (KR); Hee-Dong Choi, Chungnam (KR); Seong-Moh Seo, Gyeonggi-do (KR); Jun-Min Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 141 days.

(21) Appl. No.: 12/486,453

(22) Filed: Jun. 17, 2009

(65) Prior Publication Data

US 2010/0117090 A1 May 13, 2010

(30) Foreign Application Priority Data

Nov. 7, 2008 (KR) ................. 10-2008-0110664

(51) Int. Cl.
  *H01L 21/336* (2006.01)
(52) U.S. Cl. .................. 438/158; 257/E21.414
(58) Field of Classification Search .............. 257/66, 257/E29.294, E21.414; 438/160, 158
  See application file for complete search history.

(56) References Cited

U.S. PATENT DOCUMENTS

| | | | | |
|---|---|---|---|---|
| 5,010,027 A | * | 4/1991 | Possin et al. | 438/159 |
| 5,530,265 A | * | 6/1996 | Takemura | 257/66 |
| 5,648,662 A | * | 7/1997 | Zhang et al. | 257/59 |
| 6,019,796 A | * | 2/2000 | Mei et al. | 438/151 |
| 6,204,156 B1 | * | 3/2001 | Ping | 438/488 |
| 6,703,268 B2 | * | 3/2004 | Ping | 438/166 |
| 6,949,391 B2 | * | 9/2005 | You | 438/30 |
| 2008/0171409 A1 | * | 7/2008 | Cheng et al. | 438/160 |
| 2008/0227244 A1 | * | 9/2008 | Kim | 438/160 |

* cited by examiner

*Primary Examiner* — William D Coleman
(74) *Attorney, Agent, or Firm* — Morgan, Lewis & Bockius LLP

(57) ABSTRACT

A method of fabricating an array substrate includes: forming a gate line and a gate electrode connected to the gate line; forming a gate insulating layer on the gate line and the gate insulting layer; sequentially forming an intrinsic amorphous silicon pattern and an impurity-doped amorphous silicon pattern on the gate insulating layer over the gate electrode; forming a data line on the gate insulating layer and source and drain electrodes on the impurity-doped amorphous silicon pattern, the data line crossing the gate line to define a pixel region, and the source and drain electrodes spaced apart from each other; removing a portion of the impurity-doped amorphous silicon pattern exposed through the source and drain electrodes to define an ohmic contact layer; irradiating a first laser beam onto the intrinsic amorphous silicon pattern through the source and drain electrode to form an active layer including a first portion of polycrystalline silicon and a second portion of amorphous silicon at both sides of the first portion; forming a passivation layer on the data line, the source electrode and the drain electrode, the passivation layer having a drain contact hole exposing the drain electrode; and forming a pixel electrode on the passivation layer in the pixel region, the pixel electrode connected to the drain electrode through the drain contact hole.

12 Claims, 12 Drawing Sheets

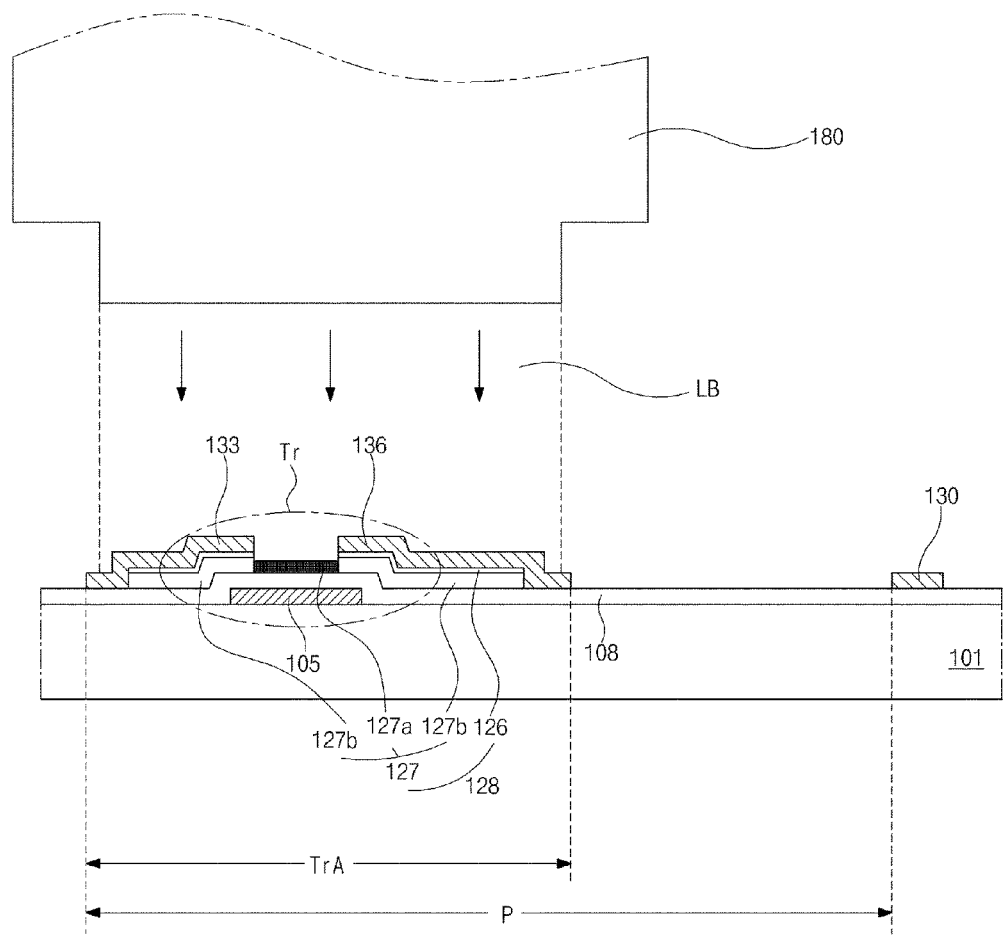

ARRAY SUBSTRATE INCLUDING THIN FILM TRANSISTOR AND METHOD OF FABRICATING THE SAME

This application claims the benefit of Korean Patent Application No. 10-2008-0110664, filed in Korea on Nov. 7, 2008, which is hereby incorporated by reference in its entirety.

BACKGROUND OF THE INVENTION

1. Field of the Invention

The present application relates to an array substrate for a display device, and more particularly, to an array substrate including a thin film transistor that has a channel region of polycrystalline silicon and a method of fabricating the array substrate.

2. Discussion of the Related Art

As information age progresses, flat panel display (FPD) devices having light weight, thin profile, and low power consumption have been substituted for cathode ray tube (CRT) devices. Liquid crystal display (LCD) devices, plasma display panel (PDP) devices, field emission display (FED) devices, and electroluminescent display (ELD) devices are examples of the FPD devices. Since the LCD device including thin film transistors as a switching element that controls an applied voltage to each pixel, referred to as an active matrix LCD (AM-LCD) device, has excellent characteristics of high resolution and displaying moving images, the AM-LCD device has been widely used.

In addition, the ELD devices using an organic emitting material, referred to as organic electroluminescent display (OELD) devices, display images with relatively high brightness and low drive voltages. Since the OELD devices have an emissive type, the OELD devices have a preferred contrast ratio with an ultra slim profile. Additionally, the can easily display moving images because they have a short response time of only several microseconds. Moreover, the OELD devices have no limitation in viewing angle and stably operate even at relatively low temperatures. Furthermore, since the OELD devices operates with only a low voltage, for example, about 5V to 15V DC (direct current), driving circuits for the OELD devices can be cheaply and easily fabricated. Accordingly, the OELD devices have been the subject of recent research and development.

Each of the LCD devices and the OELD devices includes an array substrate having a thin film transistor (TFT) as a switching element that controls an applied voltage to each pixel. Accordingly, the TFT in each pixel region is connected to a gate line, a data line and a pixel electrode to transmit a data signal of the data line to the pixel electrode according to a gate signal of the gate line.

FIG. 1 is a cross-sectional view showing a thin film transistor having a semiconductor layer of amorphous silicon for an array substrate according to the related art. In FIG. 1, a gate electrode 10 is formed on a substrate 9 in a transistor area TrA of a pixel region P and a gate insulating layer 18 is formed on the gate electrode 10. A semiconductor layer 20 including an active layer 20a of intrinsic amorphous silicon and an ohmic contact layer 20b of impurity-doped amorphous silicon is formed on the gate insulating layer 18 over the gate electrode 10. The ohmic contact layer 20b on end portions of the active layer 20a is spaced apart from each other to expose a central portion of the active layer 20a. Source and drain electrodes 26 and 28 are formed on the ohmic contact layer 20b to expose the central portion of the active layer 20a. The gate electrode 10, the gate insulating layer 18, the semiconductor layer 20, the source electrode 26 and the drain electrode 28 constitute a thin film transistor (TFT) Tr.

A passivation layer 36 is formed on the TFT Tr and has a drain contact hole 30 exposing the drain electrode 28. A pixel electrode 38 is formed on the passivation layer 36 and is connected to the drain electrode 28 through the drain contact hole 30. Although not shown in FIG. 1, a gate line connected to the gate electrode 10 and a data line connected to the source electrode 26 are formed over the substrate 9.

In the array substrate according to the related art, the active layer 20a of the TFT Tr includes amorphous silicon. Since the amorphous silicon has a random atomic arrangement, the amorphous silicon has a quasi-static state when a light is irradiated or when an electric field is applied. As a result, the TFT having the active layer 20a of amorphous silicon has a disadvantage in stability. In addition, since carriers in a channel region of the active layer 20a of amorphous silicon have a relatively low mobility within a range of about 0.1 $cm^2$/Vsec to about 1.0 $cm^2$/Vsec, the TFT having the active layer 20a of amorphous silicon has a disadvantage in usage for a switching element of a driving circuit.

To solve the above problems of amorphous silicon, a TFT having an active layer of polycrystalline silicon and a method of fabricating the TFT by crystallizing amorphous silicon to form polycrystalline silicon have been suggested. For example, amorphous silicon of the active layer may be crystallized by an excimer laser annealing (ELA) process to become polycrystalline silicon.

FIG. 2 is a cross-sectional view showing a thin film transistor having a semiconductor layer of polycrystalline silicon for an array substrate according to the related art. In FIG. 2, a buffer layer 53 is formed on a substrate 51 and a semiconductor layer 55 including a channel region 55a, a source region 55b and a drain region 55c is formed on the buffer layer 53. The channel region 55a includes intrinsic polycrystalline silicon and the source and drain regions 55b and 55c at both sides of the channel region 55a includes impurity-doped polycrystalline silicon. For example, the source and drain regions 55b and 55c may be doped with positive impurities of high concentration (p+) or negative impurities of high concentration (n+). A gate insulating layer 58 is formed on the semiconductor layer 55 and a gate electrode 59 is formed on the gate insulating layer 58 over the semiconductor layer 55. An interlayer insulating layer 61 is formed on the gate electrode 59. The gate insulating layer 58 and the interlayer insulating layer 61 includes first and second contact holes 63 and 64 exposing the source and drain regions 55b and 55c, respectively.

In addition, source and drain electrodes 70 and 72 are formed on the interlayer insulating layer 61. The source and drain electrodes 70 and 72 are connected to the source and drain regions 55b and 55c through the first and second contact holes 63 and 64, respectively. The semiconductor layer 55, the gate insulating layer 58, the gate electrode 59, the source electrode 70 and the drain electrode 72 constitute a thin film transistor (TFT) Tr. A passivation layer 75 is formed on the source and drain electrodes 70 and 72, and a pixel electrode 82 is formed on the passivation layer 75. The passivation layer 75 includes a third contact hole 78 exposing the drain electrode 72 and the pixel electrode 82 is connected to the drain electrode 72 through the third contact hole 78.

The source and drain regions 55b and 55c may be doped with impurities using a doping apparatus. As a result, an additional apparatus is required for the TFT Tr having the semiconductor layer 55 of polycrystalline silicon and fabrication cost increases. Further, since the TFT Tr having the semiconductor layer 55 of polycrystalline silicon has a complicated structure as compared with the TFT Tr (of FIG. 1)

having a semiconductor layer 20 (of FIG. 1) of amorphous silicon, production yield is reduced.

Moreover, the semiconductor layer 55 of polycrystalline silicon may be obtained by an excimer laser annealing (ELA) process using an excimer laser apparatus. The excimer laser apparatus emits pulsed rays having a wavelength of about 308 nm using a gas of xenon chloride (XeCl). Since the pulsed rays of the excimer laser apparatus have a relatively great fluctuation in energy density, the semiconductor layer 55 has different crystallinities according to positions. As a result, the TFT Tr has non-uniform characteristics according to positions and display quality of a display device having the TFT Tr is deteriorated by a striped stain due to the non-uniformity in characteristics of the TFT Tr.

As compared with an array substrate for an LCD device driven by a voltage, specifically, an array substrate for an OELD device is driven by a current. Accordingly, a grey level of an image is controlled by a current flowing through a driving transistor in an array substrate for an OELD device. As a result, the non-uniformity in characteristics of the TFT Tr having a semiconductor layer 55 of polycrystalline silicon further deteriorates display quality in an array substrate for an OELD device.

Therefore, the TFT having a semiconductor layer of amorphous silicon has disadvantages in stability and mobility, and the TFT having a semiconductor layer of polycrystalline silicon has disadvantages in uniformity and productivity.

SUMMARY OF THE INVENTION

Accordingly, embodiments of the invention are directed to an array substrate including a thin film transistor for a display device and a method of fabricating the array substrate that substantially obviate one or more of problems due to limitations and disadvantages of the related art.

An advantage of the invention is to provide an array substrate for a display device having an improved production yield and reduced fabrication cost and a method of fabricating the array substrate.

Another advantage of the invention is to provide an array substrate for a display device where a thin film transistor has optimal stability and optimal uniformity and a method of fabricating the array substrate.

Another advantage of the invention is to provide an array substrate for a display device where a semiconductor layer of a thin film transistor includes a channel region of polycrystalline silicon and source and drain regions of amorphous silicon and a method of fabricating the array substrate using a solid state laser.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, according to an aspect of the invention, a method of fabricating an array substrate includes: forming a gate line and a gate electrode connected to the gate line; forming a gate insulating layer on the gate line and the gate insulting layer; sequentially forming an intrinsic amorphous silicon pattern and an impurity-doped amorphous silicon pattern on the gate insulating layer over the gate electrode; forming a data line on the gate insulating layer and source and drain electrodes on the impurity-doped amorphous silicon pattern, the data line crossing the gate line to define a pixel region, and the source and drain electrodes spaced apart from each other; removing a portion of the impurity-doped amorphous silicon pattern exposed through the source and drain electrodes to define an ohmic contact layer; irradiating a first laser beam onto the intrinsic amorphous silicon pattern through the source and drain electrode to form an active layer including a first portion of polycrystalline silicon and a second portion of amorphous silicon at both sides of the first portion; forming a passivation layer on the data line, the source electrode and the drain electrode, the passivation layer having a drain contact hole exposing the drain electrode; and forming a pixel electrode on the passivation layer in the pixel region, the pixel electrode connected to the drain electrode through the drain contact hole.

In another aspect, an array substrate for a display device includes: a substrate; a gate line and a data line on the substrate, the gate line crossing the data line to define a pixel region; a thin film transistor connected to the gate line and the data line, the thin film transistor including an active layer having a first region and a second region at both sides of the first region, the first region including intrinsic polycrystalline silicon, and the second region including intrinsic amorphous silicon; and a pixel electrode in the pixel region and connected to the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 3A to 3I are cross-sectional views showing a method of fabricating an array substrate according to a first embodiment of the present invention;

DETAILED DESCRIPTION OF THE PREFERRED EMBODIMENTS

Reference will now be made in detail to the illustrated embodiments of the present invention, which are illustrated in the accompanying drawings.

FIGS. 3A to 3I are cross-sectional views showing a method of fabricating an array substrate according to a first embodiment of the present invention.

Figure 1:
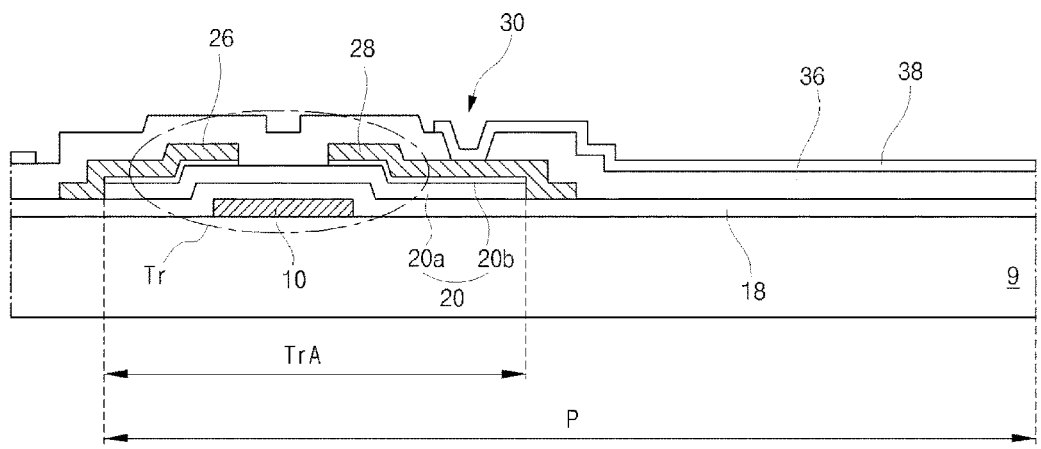
FIG. 1 is a cross-sectional view showing a thin film transistor having a semiconductor layer of amorphous silicon for an array substrate according to the related art.
Figure 2:
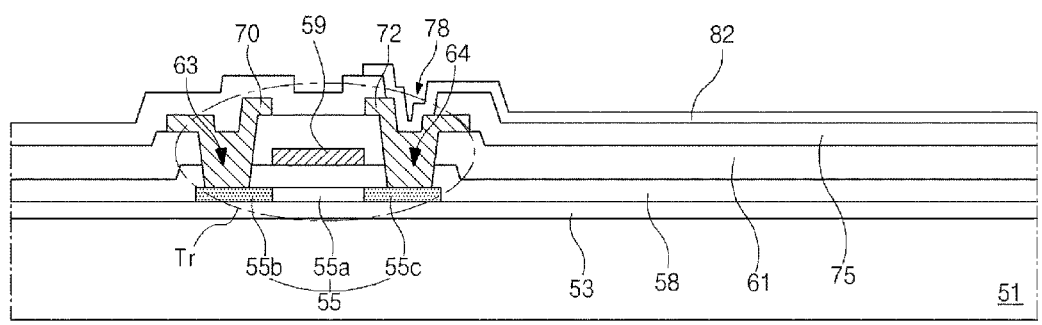
FIG. 2 is a cross-sectional view showing a thin film transistor having a semiconductor layer of polycrystalline silicon for an array substrate according to the related art.
Figure 3A:
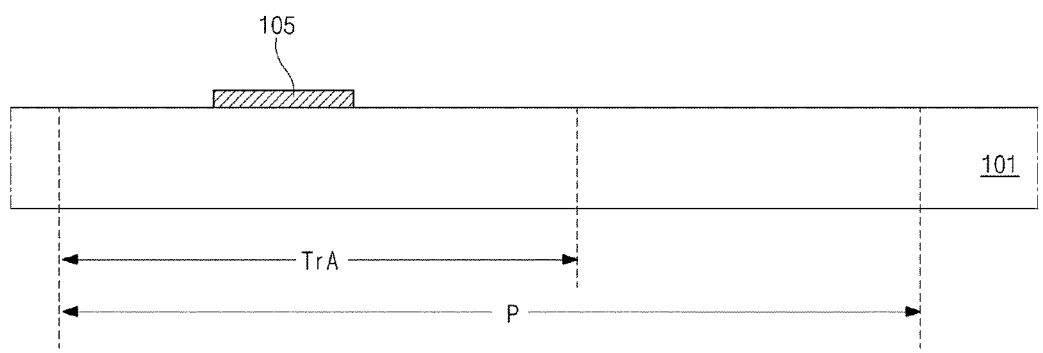

In FIG. 3A, a first metal layer (not shown) is formed on a substrate 101 by depositing a first metallic material such as one of aluminum (Al), aluminum (Al) alloy, copper (Cu), copper (Cu) alloy and chromium (Cr). Next, the first metal layer is patterned through a mask process including steps of coating a photoresist (PR), exposing the PR using a photo mask, developing the PR, etching and stripping the PR to form a gate line (not shown) and a gate electrode 105 on the substrate 101. The gate electrode 105 is disposed in a transistor area TrA of a pixel region P and is connected to the gate line. The gate line and the gate electrode 105 may include at least two layers having different metallic materials in another embodiment.

Figure 3B:
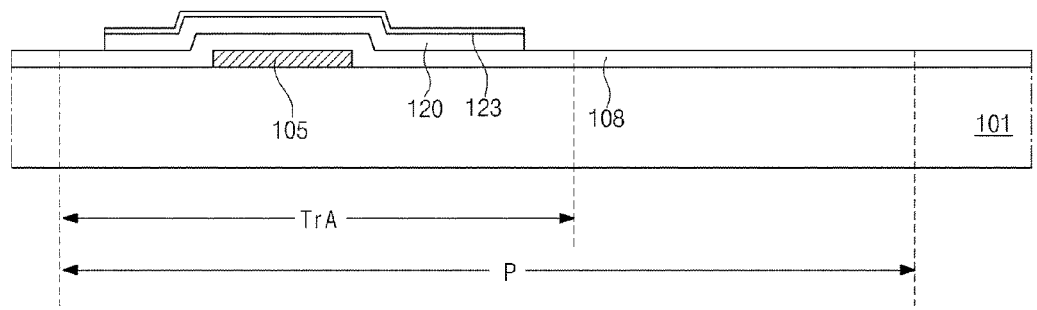

In FIG. 3B, a gate insulating layer 108 is formed on the gate line and the gate electrode 105 by depositing an inorganic insulating material such as one of silicon nitride (SiNx) and silicon oxide (SiO$_2$). Sequentially, an intrinsic amorphous silicon layer (not shown) and an impurity-doped amorphous silicon layer (not shown) are formed on the gate insulating layer 108 by sequentially depositing intrinsic amorphous silicon and impurity-doped amorphous silicon. Next, the intrinsic amorphous silicon layer and the impurity-doped amorphous silicon layer are patterned through a mask process to form an intrinsic amorphous silicon pattern 120 and an impurity-doped amorphous silicon pattern 123 on the gate insulating layer 108 in the transistor area TrA.

Figure 3C:
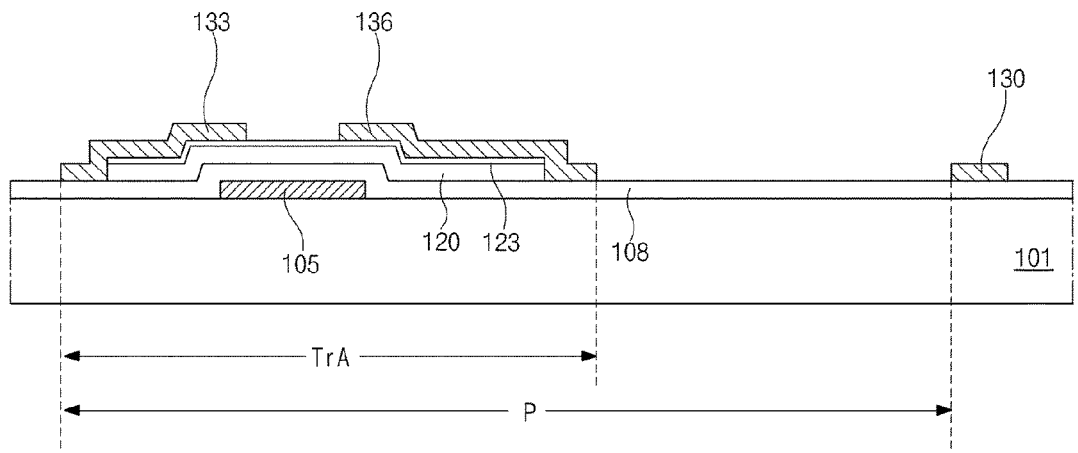

In FIG. 3C, a second metal layer (not shown) is formed on the impurity-doped amorphous silicon pattern 123 by depositing a second metallic material such as one of aluminum (Al), aluminum (Al) alloy, copper (Cu), copper (Cu) alloy and chromium (Cr). Next, the second metal layer is patterned through a mask process to form a data line 130, a source electrode 133 and a drain electrode 136. Although not shown in FIG. 3C, the data line 130 formed on the gate insulating layer 108 crosses the gate line to define the pixel region P. In addition, the source and drain electrodes 133 and 136 are formed on the impurity-doped amorphous silicon pattern 123 and are spaced apart from each other. The source electrode 133 is connected to the data line 130.

Although the intrinsic amorphous silicon pattern 120, the impurity-doped amorphous silicon pattern 123, the source electrode 133 and the drain electrode 136 are formed through two mask processes in the first embodiment, an intrinsic amorphous silicon pattern, an impurity-doped amorphous silicon pattern, a source electrode and a drain electrode may be formed through a single mask process in another embodiment.

FIGS. 4A to 4D are cross-sectional views showing a method of fabricating an array substrate according to a second embodiment of the present invention. FIGS. 4A to 4D show partial steps of the second embodiment corresponding to FIGS. 3B and 3C.

Figure 4A:
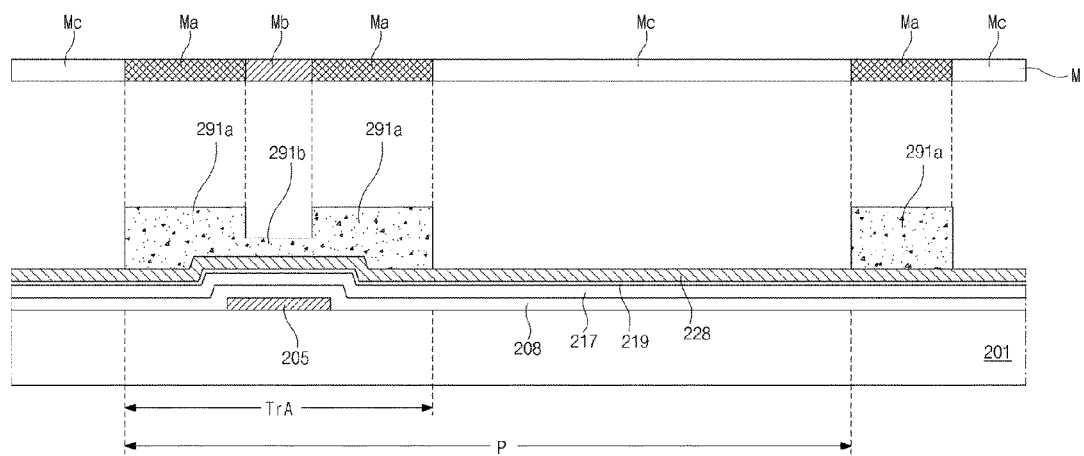
FIGS. 4A to 4D are cross-sectional views showing a method of fabricating an array substrate according to a second embodiment of the present invention.

In FIG. 4A, a gate insulating layer 208 is formed on a gate line (not shown) and a gate electrode 205 by depositing an inorganic insulating material such as one of silicon nitride (SiNx) and silicon oxide (SiO$_2$). In addition, an intrinsic amorphous silicon layer 217 and an impurity-doped amorphous silicon layer 219 are sequentially formed on the gate insulating layer 208 by sequentially depositing intrinsic amorphous silicon and impurity-doped amorphous silicon. Further, a second metal layer 228 is formed on the impurity-doped amorphous silicon layer 219 by depositing a second metallic material such as one of aluminum (Al), aluminum (Al) alloy, copper (Cu), copper (Cu) alloy and chromium (Cr).

Next, a photoresist (PR) layer (not shown) may be formed on the second metal layer 228 by a coating method and a photo mask M is disposed over the PR layer. The photo mask M has a blocking portion Ma, a half-transmissive portion Mb and a transmissive portion Ma, where a transmittance of the half-transmissive portion Mb is greater than a transmittance of the blocking portion Ma and smaller than a transmittance of the transmissive portion Mc. For example, the half-transmissive portion Mb may include a slit pattern or a half-tone pattern. The PR layer is exposed through the photo mask M and developed to form first and second PR patterns 291a and 291b corresponding to the blocking and half-transmissive portions Ma and Mb, respectively. A first thickness of the first PR pattern 291a is greater than a second thickness of the second PR pattern 291b. The PR layer corresponding to the transmissive portion Mc is removed such that the second metal layer 228 is exposed through the first and second PR patterns 291a and 291b.

Figure 4B:
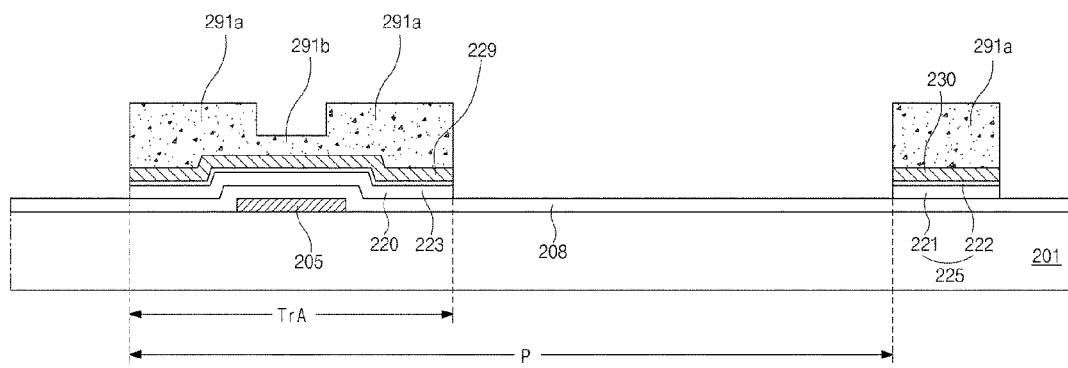

In FIG. 4B, the second metal layer 228 (of FIG. 4A) is patterned using the first and second PR patterns as an etching mask to form a source-drain pattern 229 and a data line 230. The data line 230 corresponds to the first PR pattern 291a, and central and side portions of the source-drain pattern 229 correspond to second and first PR patterns 291b and 291a, respectively. Subsequently, the impurity-doped amorphous silicon layer 219 (of FIG. 4A) and the intrinsic amorphous silicon layer 217 (of FIG. 4A) are patterned using the first and second PR patterns as an etching mask to form an impurity-doped amorphous silicon pattern 223 and an intrinsic amorphous silicon pattern 220 under the source-drain pattern 229 and a semiconductor pattern 225 under the data line 230. The semiconductor pattern 225 includes a first pattern 221 of intrinsic amorphous silicon and a second pattern 222 of impurity-doped amorphous silicon.

Figure 4C:
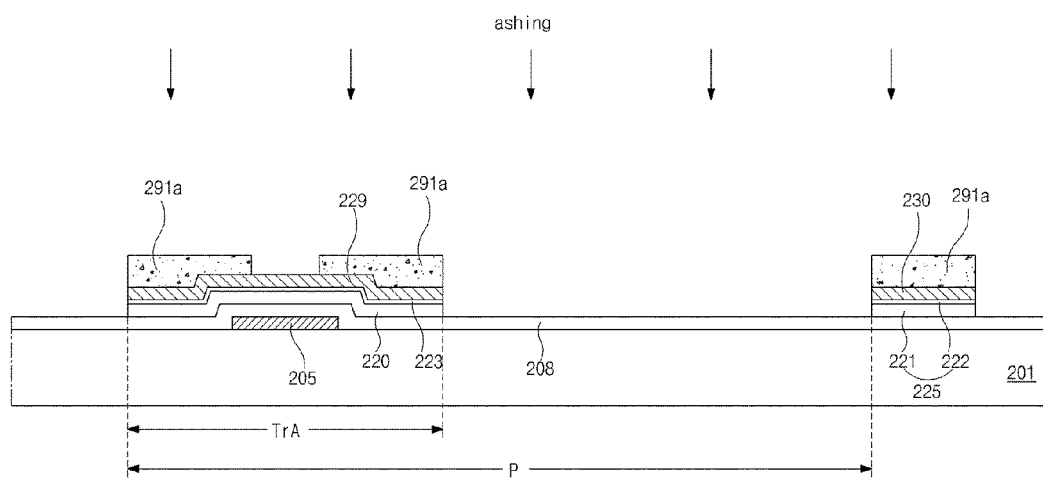

In FIG. 4C, the first PR pattern 291a is partially removed and the second PR pattern 291b is completely removed through an ashing method such that the first thickness of the first PR pattern 291a is reduced and the central portion of the source-drain pattern 229 corresponding to the second PR pattern 291b is exposed.

Figure 4D:
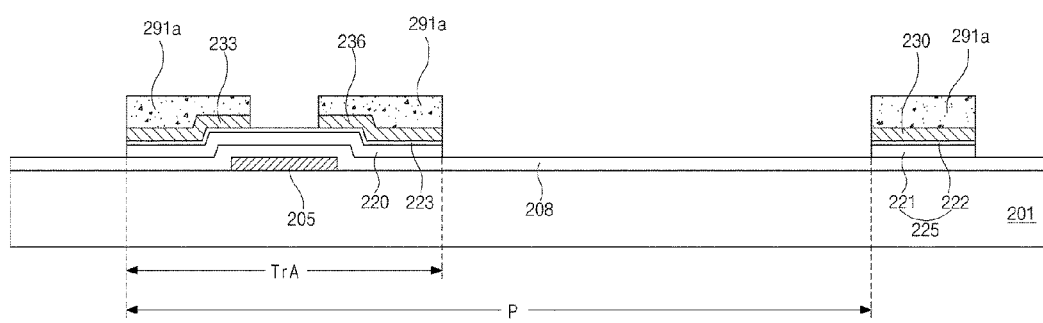

In FIG. 4D, the central portion of the source-drain pattern 229 is removed using the first PR pattern 291a as an etching mask to form source and drain electrodes 233 and 236 spaced apart from each other.

As a result, the intrinsic amorphous silicon pattern 220, the impurity-doped amorphous silicon pattern 223, the source electrode 233 and the drain electrode 236 are formed through a single mask process in the second embodiment. Contrary to the first embodiment, outer end lines of the source and drain electrodes 233 and 236 coincide with outer end lines of the impurity-doped amorphous silicon pattern 223 and the intrinsic amorphous silicon pattern 220, and the semiconductor pattern 225 is formed under the data line 230 in the second embodiment.

Figure 3D:
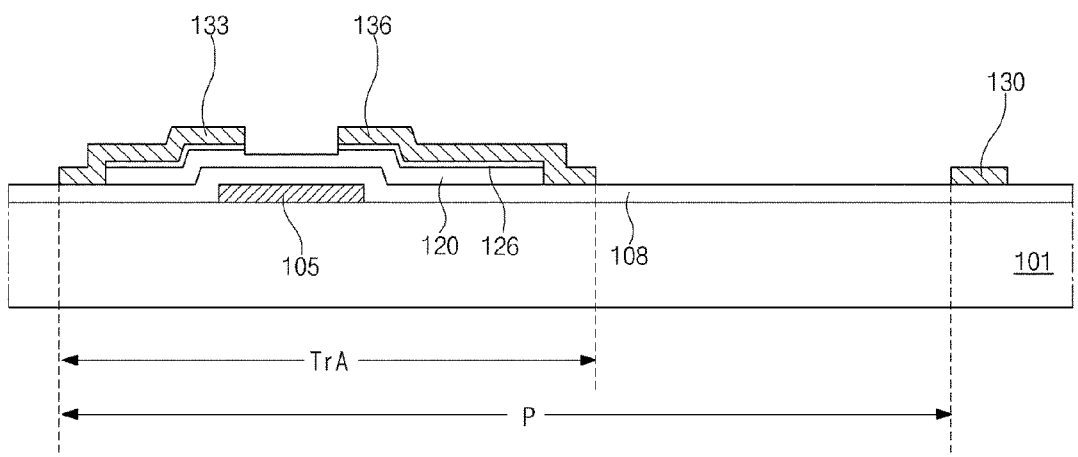

Referring again to the first embodiment, in FIG. 3D, the impurity-doped amorphous silicon pattern 123 (of FIG. 3C) exposed through the source and drain electrodes 133 and 136 is removed through a dry etching method to define an ohmic contact layer 126. The ohmic contact layer 126 of impurity-doped amorphous silicon is formed on side portions of the intrinsic amorphous silicon pattern 120 to expose a central portion of the intrinsic amorphous silicon pattern 120.

In FIG. 3E, a laser beam LB from a laser apparatus 180 is irradiated onto the substrate 101 having the source electrode 133, the drain electrode 136 and the data line 130. For example, the laser apparatus 180 may include a diode pumped solid state (DPSS) laser apparatus. The DPSS laser apparatus uses a solid state material as a source for generating the laser beam LB. Since a fluctuation in energy density of the DPSS laser apparatus using a solid state material is much smaller than a fluctuation in energy density of an excimer laser apparatus using a gaseous state material, the semiconductor layer of polycrystalline silicon has by the DPSS laser apparatus better uniformity in crystallinity than the semiconductor layer of polycrystalline silicon by the excimer laser apparatus. As a result, deterioration such as a striped stain due to non-uniform crystallinity is prevented in a display device including a thin film transistor (TFT) having a semiconductor layer of polycrystalline silicon by the DPSS laser apparatus.

The laser beam LB is irradiated onto the central portion of the intrinsic amorphous silicon pattern 120 (of FIG. 3D) through the source and drain electrodes 133 and 136. The laser beam LB may be irradiated onto the whole substrate 101 through a scanning method. Alternatively, the laser beam LB may be selectively irradiated onto the transistor area TrA. Accordingly, the central portion of the intrinsic amorphous silicon pattern 120 is crystallized to become a first region 127a of intrinsic polycrystalline silicon and the side portions of the intrinsic amorphous silicon pattern 120 remains without phase transition to become a second region 127b of intrinsic amorphous silicon. The first and second regions 127a and 127b constitute an active layer 127, and the active layer 127 and the ohmic contact layer 126 constitute a semiconductor layer 128. Further, the gate electrode 105, the gate insulating layer 108, the semiconductor layer 128, the source electrode 133 and the drain electrode 136 constitute a thin film transistor (TFT) Tr.

The property of the first region 127a of intrinsic polycrystalline silicon depends on a power of laser beam irradiation, i.e., an energy density of the laser beam LB and an irradiation time. When the laser beam LB is irradiated with a relatively high power, the first region 127a has a rough top surface having a plurality of uneven portions due to explosion of hydrogen atoms in the intrinsic amorphous silicon pattern 120. The rough top surface deteriorates interface property between the active layer and a subsequent insulating layer, i.e., a passivation layer 140 (of FIG. 3H) and characteristics of the TFT Tr. In addition, uniformity in characteristic of the TFT Tr is also deteriorated. When the laser beam LB is irradiated with a relatively low power, the first region 127a is not sufficiently crystallized. Accordingly, mobility and stability of the TFT Tr are deteriorated. Accordingly, the laser beam LB is irradiated with an optimum power within a range of about 15.4 Watt and about 16.2 Watt.

The central portion of the intrinsic amorphous silicon pattern 120 is liquefied by the laser beam LB and is crystallized during solidification to become intrinsic polycrystalline silicon. Since the laser beam LB is blocked by the source and drain electrodes 133 and 136, the laser beam LB is not irradiated onto the ohmic contact layer 126 and the side portions of the intrinsic amorphous silicon pattern 120. As a result, the ohmic contact layer 126 and the side portions of the intrinsic amorphous silicon pattern 120 are not crystallized and remain as amorphous state even after irradiation of the laser beam LB.

Accordingly, the semiconductor layer 128 of the TFT Tr includes the active layer 127 and the ohmic contact layer 126 of impurity-doped amorphous silicon on the side portions of the active layer 127, and the active layer 127 includes the first region 127a of intrinsic polycrystalline silicon at the central portion thereof and the second region 127b of intrinsic amorphous silicon at the side portions thereof. The first region 127a is exposed through the source and drain electrodes 133 and 136, and the second region 127b is disposed at both sides of the first region 127a. Since the first region 127a functioning as a channel region that is a path of carriers such as holes and electrons includes polycrystalline silicon, mobility of the TFT Tr is improved as compared with a TFT having a channel region of amorphous silicon according to the related art.

Figure 3F:
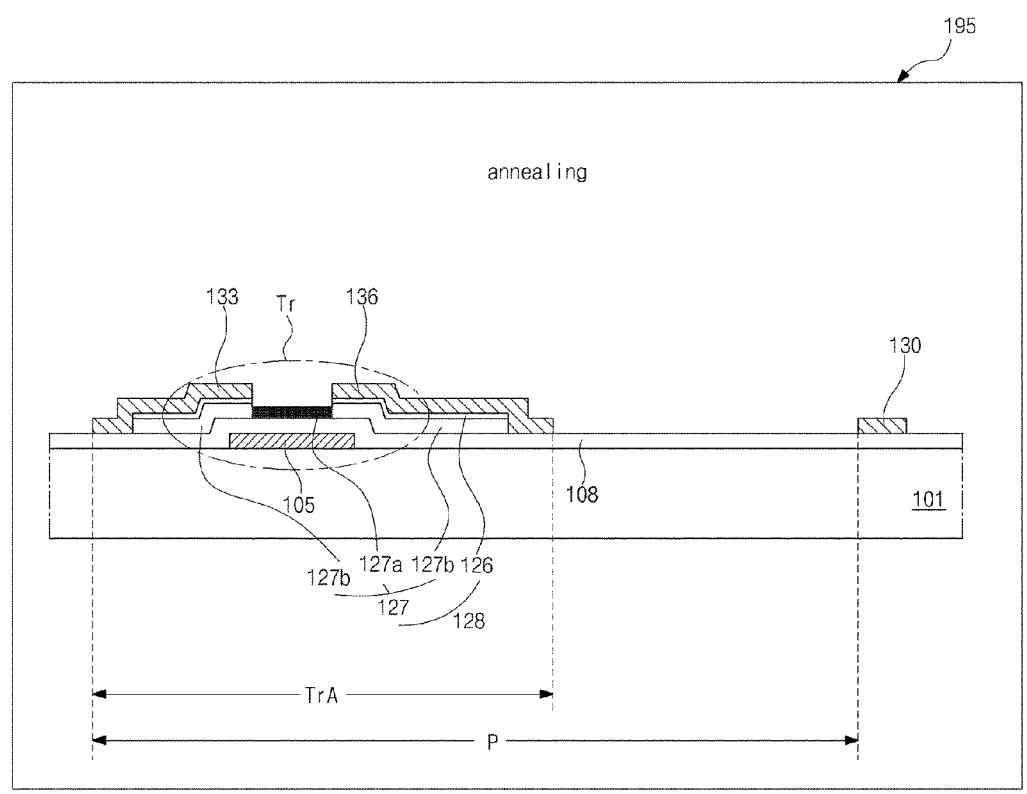

In FIG. 3F, after the irradiating step of the laser beam LB (of FIG. 3E), the substrate 101 having the TFT Tr is annealed in an annealing apparatus 195 to cure the first region 127a of the active layer 127. For example, the substrate 101 may be annealed in an annealing apparatus such as an oven and a baking apparatus at a temperature of about 280° C. to about 350° C. for a time period of about 30 min to about 120 min. Due to the annealing step, the first region 127a of the active layer 127 has stabilized molecular state and improved crystallinity.

Figure 3G:
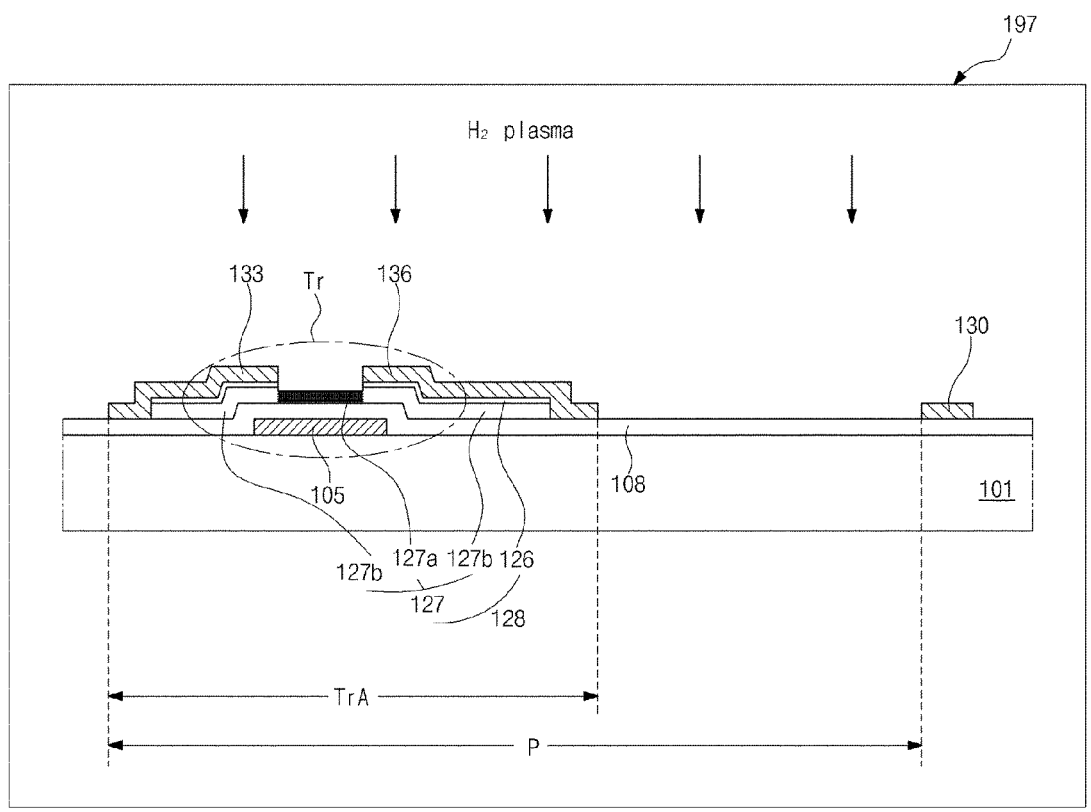

In FIG. 3G, after the annealing step, the substrate 101 is treated with hydrogen ($H_2$) plasma in a vacuum chamber 197. For example, hydrogen gas of a flow rate of about 1000 sccm to about 2000 sccm may be supplied to the vacuum chamber 197 and the vacuum chamber may have a pressure of about 10 mTorr to about 100 mTorr. Further, the substrate 101 may be treated with hydrogen plasma for a time period of about 2 min to about 4.5 min.

The hydrogen atoms are ejected from amorphous silicon structure of the active layer 127 due to the irradiation of the laser beam LB (of FIG. 3E), and the hydrogen atoms are injected into polycrystalline structure of the active layer 127 during the hydrogen plasma treatment. The intrinsic amorphous silicon layer is formed through a plasma enhanced chemical vapor deposition (PECVD) method using a mixture of silane gas ($SiH_4$) and hydrogen ($H_2$) gas. Silicon (Si) atoms in the intrinsic amorphous silicon layer are arranged in a random network having dangling bonds where connection between silicon atoms are broken, and hydrogen atoms are combined with the silicon atoms of the dangling bonds to reduce the dangling bonds. While the intrinsic amorphous silicon layer is liquefied by the laser beam LB, the hydrogen atoms are ejected from the intrinsic amorphous silicon layer to increase the dangling bonds. Accordingly, the dangling bonds are reduced by the hydrogen plasma treatment after irradiation of the laser beam LB, thereby mobility and uniformity of the TFT Tr improved.

Figure 3H:
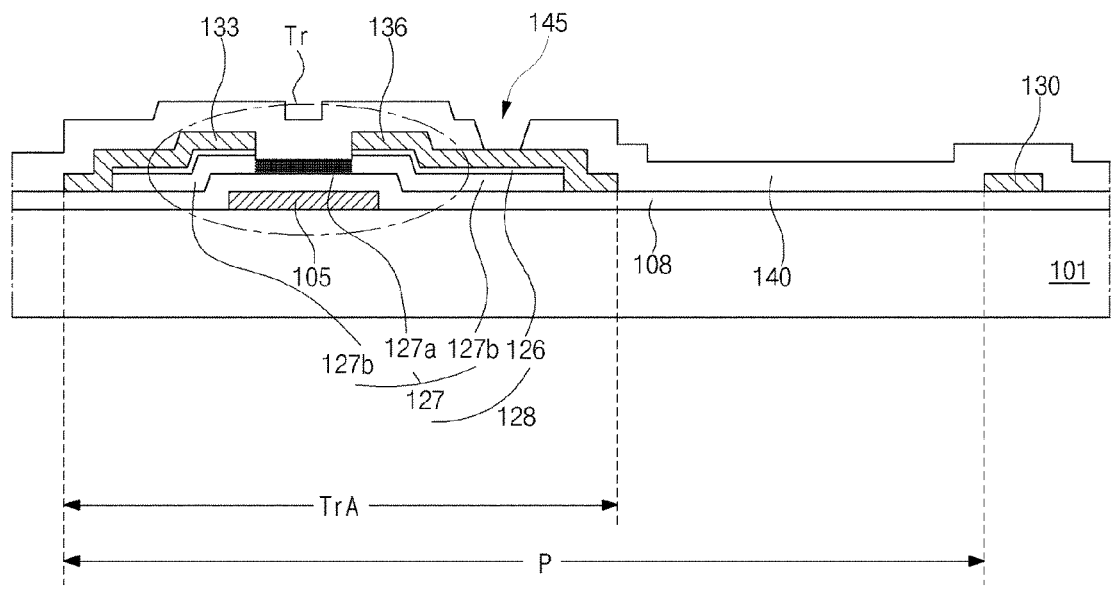

In FIG. 3H, after the treating step using hydrogen plasma, a passivation layer 140 is formed on the source electrode 133, the drain electrode 136 and the data line 130 by depositing an inorganic insulating material such as silicon nitride (SiNx) and silicon oxide ($SiO_2$) or by coating an organic insulating material such as benzocyclobutene (BCB) and acrylic resin. Next, the passivation layer 140 is patterned through a mask process to form a drain contact hole 145 exposing the drain electrode 136.

Figure 3I:
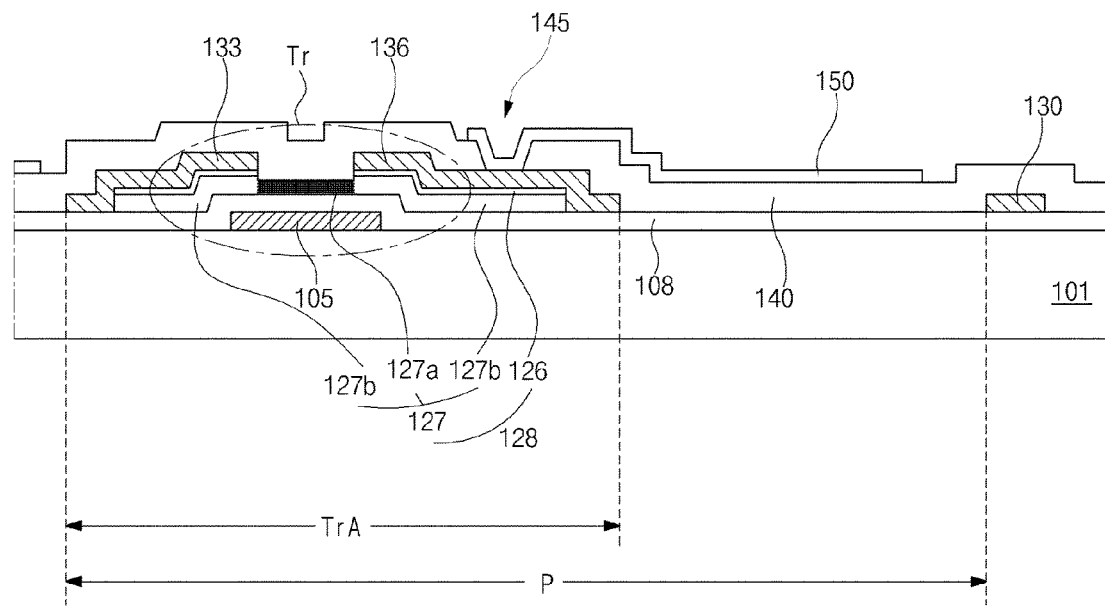

In FIG. 3I, a transparent conductive material layer (not shown) is formed on the passivation layer 140 by depositing one of indium-tin-oxide (ITO) and indium-zinc-oxide (IZO). Next, the transparent conductive material layer is patterned through a mask process to form a pixel electrode 150 in each pixel region P. The pixel electrode 150 is connected to the drain electrode 136 through the drain contact hole 145.

Figure 5:
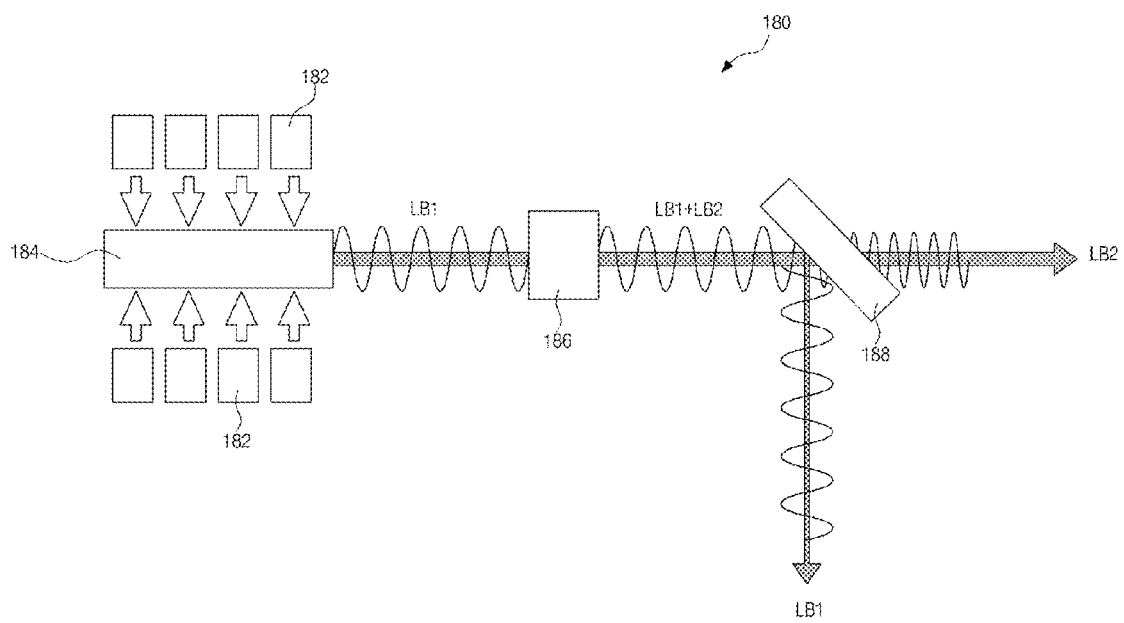
FIG. 5 is view of a diode pumped solid state (DPSS) laser apparatus for fabricating an array substrate according to an embodiment of the present invention.

FIG. 5 is view of a diode pumped solid state (DPSS) laser apparatus for fabricating an array substrate according to an embodiment of the present invention.

In FIG. 5, a DPSS laser apparatus 180 includes a plurality of diodes 182, an yttrium aluminum garnet (YAG) rod 184, a second-harmonic generation (SHG) optic means 186 and a wavelength separation mirror (WSM) 188. The plurality of diodes emit an infrared (IR) ray to supply a light energy to the YAG rod 184 and the YAG rod 184 generates a first laser beam LB1 using the IR ray from the plurality of diodes 182. Atoms of the YAG rod 184 are excited by the IR ray to have an excited state. When the excited atoms return to a ground state, the first laser beam LB1 having a first wavelength corresponding to the energy gap between the excited state and the ground state is emitted from the YAG rod 184. Since the atoms of the YAG rod 184 is excited by the IR ray, the first laser beam LB1 may correspond to the IR ray. For example, the first laser beam LB1 may have the first wavelength of about 1064 nm.

The SHG optic means 186 doubles a frequency of a portion of the first laser beam LB1 from the YAG rod 184. Accordingly, while the first laser beam LB1 passes through the SHG optic means 186, the portion of the first laser beam LB1 is modulated to a second laser beam LB2 having a second wavelength shorter than the first wavelength and the other portion of the first laser beam remains without change in wavelength. As a result, a mixture of the first and second laser beams LB1 and LB2 is emitted from the SHG optic means 186. For example, the first and second wavelengths may be about 1064 nm and about 532 nm, respectively. The mixture of the first and second laser beams LB1 and LB2 is split by the WSM 188. Accordingly, the first and second laser beams LB1 and LB2 is emitted from the WSM 188 along respective directions, and the second laser beam LB2 corresponding to a visual light is used for crystallization of amorphous silicon.

When used for about 15 hours to about 18 hours a day, the plurality of diodes 182 and the YAG rod 184 of the DPSS laser apparatus 180 have a lifetime of about one year, which is twice or three times of the lifetime of a gaseous state source material or a liquid state source material of the other laser apparatus. Accordingly, a material cost for fabricating an array substrate using DPSS laser apparatus 180 is reduced. In addition, since a fluctuation in energy density of the DPSS laser apparatus 180 using the plurality of diodes 182 and the YAG rod 184 is much smaller than a fluctuation in energy density of the other laser apparatus using a gaseous state source material or a liquid state source material, the semiconductor layer of polycrystalline silicon has by the DPSS laser apparatus better uniformity in crystallinity than the semiconductor layer of polycrystalline silicon by the excimer laser apparatus.

FIGS. 6A, 6B, 6C and 6D are scanning electron microscope images showing top surfaces of polycrystalline silicon crystallized with a laser beam of about 15.4 Watt, about 16.2 Watt, about 18.4 Watt and about 19.5 Watt, respectively.

Figure 6A:
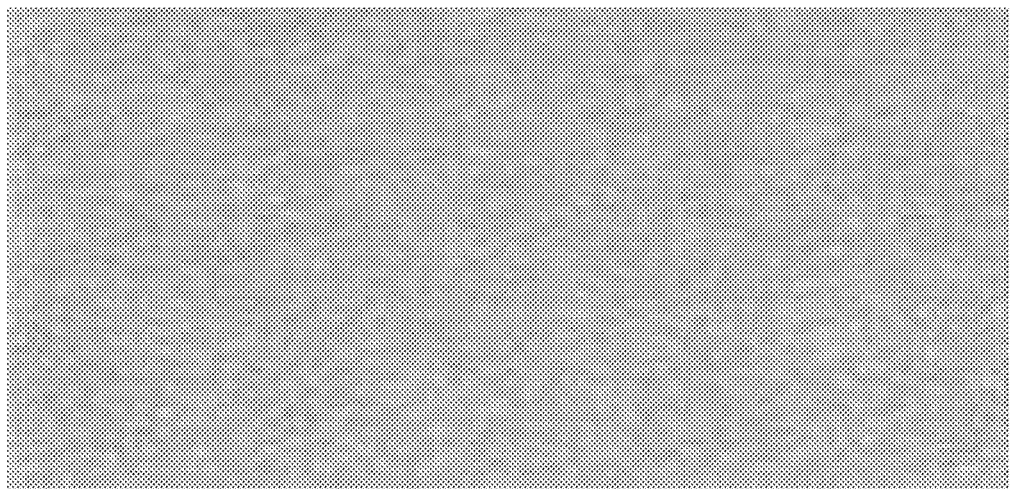
FIGS. 6A, 6B, 6C and 6D are scanning electron microscope images showing top surfaces of polycrystalline silicon crystallized with a laser beam of about 15.4 Watt, about 16.2 Watt, about 18.4 Watt and about 19.5 Watt, respectively.
Figure 6B:
Figure 6C:
Figure 6D:
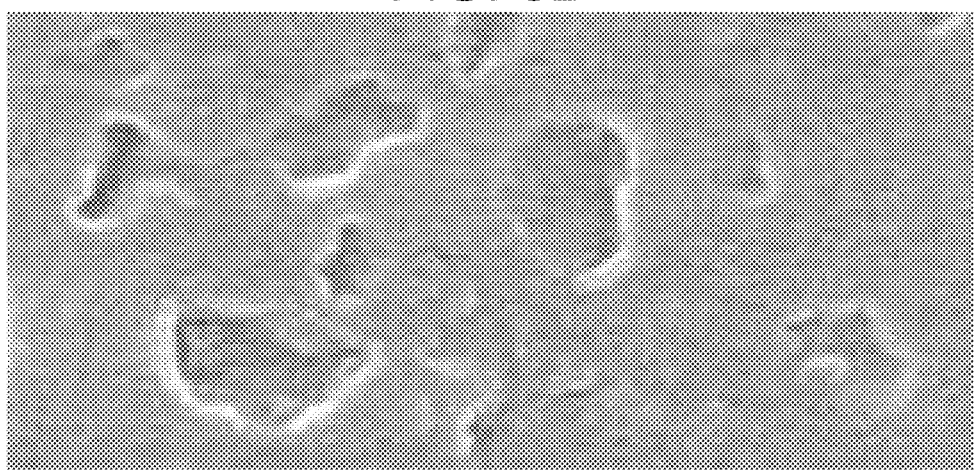

As shown in FIGS. 6A and 6B, when amorphous silicon is crystallized with a laser beam of one of about 15.4 Watt and 16.2 Watt, polycrystalline silicon has smooth top surface. As shown in FIGS. 6C and 6D, when amorphous silicon is crystallized with a laser beam of one of about 18.4 Watt and about 19.5 Watt, polycrystalline silicon has rough top surface having uneven portions generated by explosion of hydrogen atoms in the amorphous silicon. Although not shown in FIGS. 6A to 6D, when amorphous silicon is crystallized with a laser beam of a power smaller than about 15.4 Watt, crystallinity of polycrystalline silicon is not sufficient. Accordingly, when amorphous silicon is crystallized with a laser beam of a power within a range of about 15.4 Watt to about 16.2 Watt, polycrystalline silicon has an excellent property for a thin film transistor.

Consequently, in an array substrate according to the present invention, since the channel region of the semiconductor layer of the TFT includes polycrystalline silicon, mobility and stability of the TFT are improved. Further, the channel region of the semiconductor layer of the TFT is crystallized using a solid state laser, uniformity of crystallinity and uniformity in characteristics of the TFT are improved and deterioration such as a striped stain in display quality is prevented. In addition, since the TFT is fabricated without a doping apparatus, fabrication process is simplified and fabrication cost is reduced. Moreover, since the TFT has a simplified structure, fabrication process is further improved and productivity increases.

It will be apparent to those skilled in the art that various modifications and variations can be made in an array substrate including a thin film transistor and a method of fabricating the array substrate of embodiments of the invention without departing from the spirit or scope of the invention. Thus, it is intended that embodiments of the invention cover the modifications and variations of this invention provided they come within the scope of the appended claims and their equivalents.

What is claimed is:

1. A method of fabricating an array substrate, comprising:
   forming a gate line and a gate electrode connected to the gate line;
   forming a gate insulating layer on the gate line and the gate insulting layer;
   sequentially forming an intrinsic amorphous silicon pattern and an impurity-doped amorphous silicon pattern on the gate insulating layer over the gate electrode;
   forming a data line on the gate insulating layer and source and drain electrodes on the impurity-doped amorphous silicon pattern, the data line crossing the gate line to define a pixel region, and the source and drain electrodes spaced apart from each other;
   removing a portion of the impurity-doped amorphous silicon pattern exposed through the source and drain electrodes to define an ohmic contact layer;
   irradiating a first laser beam onto the intrinsic amorphous silicon pattern through the source and drain electrodes to form an active layer including a first portion of polycrystalline silicon and a second portion of amorphous silicon at both sides of the first portion;
   forming a passivation layer on the data line, the source electrode and the drain electrode, the passivation layer having a drain contact hole exposing the drain electrode; and
   forming a pixel electrode on the passivation layer in the pixel region, the pixel electrode connected to the drain electrode through the drain contact hole.

2. A method of fabricating an array substrate, comprising:
   forming a gate line and a gate electrode connected to the gate line;
   forming a gate insulating layer on the gate line and the gate insulting layer;
   sequentially forming an intrinsic amorphous silicon pattern and an impurity-doped amorphous silicon pattern on the gate insulating layer over the gate electrode;
   forming a data line on the gate insulating layer and source and drain electrodes on the impurity-doped amorphous silicon pattern, the data line crossing the gate line to define a pixel region, and the source and drain electrodes spaced apart from each other;
   removing a portion of the impurity-doped amorphous silicon pattern exposed through the source and drain electrodes to define an ohmic contact layer;
   irradiating a first laser beam onto the intrinsic amorphous silicon pattern through the source and drain electrodes to form an active layer including a first portion of polycrystalline silicon and a second portion of amorphous silicon at both sides of the first portion;
   forming a passivation layer on the data line, the source electrode and the drain electrode, the passivation layer having a drain contact hole exposing the drain electrode; and forming a pixel electrode on the passivation layer in the pixel region, the pixel electrode connected to the drain electrode through the drain contact hole, wherein irradiating the first laser beam is performed using a solid state laser.

3. The method according to claim 2, wherein the first laser beam is emitted from a diode pumped solid state laser apparatus comprising: a plurality of diodes emitting an infrared ray; an yttrium aluminum garnet rod generating a second laser beam using the infrared ray; a second-harmonic generation optic means doubling a frequency of a portion of the second laser beam to output the first laser beam of a first wavelength and the second laser beam of a second wavelength greater than the first wavelength; a wave separation mirror splitting the first and second laser beam.

4. The method according to claim 3, wherein the first laser beam has a power within a range of about 15.4 Watt to about 16.2 Watt.

5. A method of fabricating an array substrate, comprising:
forming a gate line and a gate electrode connected to the gate line;
forming a gate insulating layer on the gate line and the gate insulting layer;
sequentially forming an intrinsic amorphous silicon pattern and an impurity-doped amorphous silicon pattern on the gate insulating layer over the gate electrode;
forming a data line on the gate insulating layer and source and drain electrodes on the impurity-doped amorphous silicon pattern, the data line crossing the gate line to define a pixel region, and the source and drain electrodes spaced apart from each other;
removing a portion of the impurity-doped amorphous silicon pattern exposed through the source and drain electrodes to define an ohmic contact layer;
irradiating a first laser beam onto the intrinsic amorphous silicon pattern through the source and drain electrodes to form an active layer including a first portion of polycrystalline silicon and a second portion of amorphous silicon at both sides of the first portion;
forming a passivation layer on the data line, the source electrode and the drain electrode, the passivation layer having a drain contact hole exposing the drain electrode;
forming a pixel electrode on the passivation layer in the pixel region, the pixel electrode connected to the drain electrode through the drain contact hole; and
annealing the active layer at a temperature of about 280° C. to about 350° C. for a time period of about 30 min to about 120 min.

6. A method of fabricating an array substrate, comprising:
forming a gate line and a gate electrode connected to the gate line;
forming a gate insulating layer on the gate line and the gate insulting layer;
sequentially forming an intrinsic amorphous silicon pattern and an impurity-doped amorphous silicon pattern on the gate insulating layer over the gate electrode;
forming a data line on the gate insulating layer and source and drain electrodes on the impurity-doped amorphous silicon pattern, the data line crossing the gate line to define a pixel region, and the source and drain electrodes spaced apart from each other;
removing a portion of the impurity-doped amorphous silicon pattern exposed through the source and drain electrodes to define an ohmic contact layer;
irradiating a first laser beam onto the intrinsic amorphous silicon pattern through the source and drain electrodes to form an active layer including a first portion of polycrystalline silicon and a second portion of amorphous silicon at both sides of the first portion;
forming a passivation layer on the data line, the source electrode and the drain electrode, the passivation layer having a drain contact hole exposing the drain electrode;
forming a pixel electrode on the passivation layer in the pixel region, the pixel electrode connected to the drain electrode through the drain contact hole; and
treating the active layer with a hydrogen plasma in a vacuum chamber.

7. The method according to claim 6, wherein a hydrogen gas is supplied to the vacuum chamber with a flow rate of about 1000 sccm to about 2000 sccm and the vacuum chamber has a pressure of about 10 mTorr to about 100 mTorr.

8. The method according to claim 6, wherein treating the active layer with the hydrogen plasma is performed for about 2 min to about 4.5 min.

9. A method of fabricating an array substrate, comprising:
forming a gate line and a gate electrode connected to the gate line;
forming a gate insulating layer on the gate line and the gate insulting layer;
sequentially forming an intrinsic amorphous silicon pattern and an impurity-doped amorphous silicon pattern on the gate insulating layer over the gate electrode;
forming a data line on the gate insulating layer and source and drain electrodes on the impurity-doped amorphous silicon pattern, the data line crossing the gate line to define a pixel region, and the source and drain electrodes spaced apart from each other;
removing a portion of the impurity-doped amorphous silicon pattern exposed through the source and drain electrodes to define an ohmic contact layer;
irradiating a first laser beam onto the intrinsic amorphous silicon pattern through the source and drain electrodes to form an active layer including a first portion of polycrystalline silicon and a second portion of amorphous silicon at both sides of the first portion;
forming a passivation layer on the data line, the source electrode and the drain electrode, the passivation layer having a drain contact hole exposing the drain electrode; and
forming a pixel electrode on the passivation layer in the pixel region, the pixel electrode connected to the drain electrode through the drain contact hole,
wherein sequentially forming the intrinsic amorphous silicon pattern and the impurity-doped amorphous silicon pattern and forming the data line, the source electrode and the drain electrode are performed through a single mask process.

10. An array substrate for a display device, comprising:
a substrate;
a gate line and a data line on the substrate, the gate line crossing the data line to define a pixel region;
a thin film transistor connected to the gate line and the data line, the thin film transistor including an active layer having a first region and a second region at both sides of the first region, the first region including intrinsic polycrystalline silicon, and the second region including intrinsic amorphous silicon; and
a pixel electrode in the pixel region and connected to the thin film transistor.

11. The substrate according to claim 10, wherein the thin film transistor further includes a gate electrode connected to the gate line, an ohmic contact layer on the active layer, a source electrode connected to the data line and a drain electrode spaced apart from the source electrode, wherein the ohmic contact layer including impurity-doped amorphous silicon, and the first region exposed through the source and drain electrodes.

12. The substrate method according to claim 11, further comprising: a gate insulating layer on the gate line and the gate electrode; and a passivation layer on the data line, the source electrode and the drain electrode, wherein the passivation layer has a drain contact hole exposing the drain electrode and the pixel electrode is connected to the drain electrode through the drain contact hole.

* * * * *